(12) United States Patent
Maex et al.

(10) Patent No.: US 6,635,964 B2
(45) Date of Patent: Oct. 21, 2003

(54) METALLIZATION STRUCTURE ON A FLUORINE-CONTAINING DIELECTRIC AND A METHOD FOR FABRICATION THEREOF

(75) Inventors: Karen Maex, Herent (BE); Mikhail Rodionovich Baklanov, Leuven (BE); Serge Vanhaelemeersch, Leuven (BE)

(73) Assignee: Interuniversitair Micro-Elektronica Centrum (IMEC vzw), Leuven (BE)

( * ) Notice: Subject to any disclaimer, the term of this patent is extended or adjusted under 35 U.S.C. 154(b) by 0 days.

(21) Appl. No.: 09/928,912

(22) Filed: Aug. 13, 2001

(65) Prior Publication Data

US 2002/0066957 A1 Jun. 6, 2002

Related U.S. Application Data

(63) Continuation of application No. 09/237,876, filed on Jan. 27, 1999, now Pat. No. 6,323,555.
(60) Provisional application No. 60/072,895, filed on Jan. 28, 1998.

(51) Int. Cl.⁷ .............................................. H01L 23/48
(52) U.S. Cl. ..................... 257/758; 257/759; 257/790; 438/643; 438/658
(58) Field of Search ................. 438/643, 658, 438/623, 624, 644, 659; 257/758, 759, 760, 790

(56) References Cited

U.S. PATENT DOCUMENTS

| | | | |
|---|---|---|---|
| 5,661,334 A | | 8/1997 | Akram |
| 5,850,102 A | * | 12/1998 | Matsuno .................... 257/635 |
| 5,874,779 A | * | 2/1999 | Matsuno .................... 257/758 |
| 6,005,291 A | * | 12/1999 | Koyanagi et al. ........... 257/751 |
| 6,265,779 B1 | * | 7/2001 | Grill et al. .................. 257/759 |

FOREIGN PATENT DOCUMENTS

| | | |
|---|---|---|
| EP | 0 849 796 A2 | 6/1998 |
| GB | 2 323 968 A | 10/1998 |
| JP | 9-275138 | 10/1997 |

OTHER PUBLICATIONS

Thermal Stability Study of The Interconnect System with Fluorinated Silicate Glass As IMD Layers, Weidan Li and Wilbur Catabay, Mat. Res. Soc. Symp. Proc. vol. 476, 1997 Materials Research Society.

* cited by examiner

*Primary Examiner*—Caridad Everhart
(74) *Attorney, Agent, or Firm*—Knobbe Martens Olsen & Bear LLP

(57) ABSTRACT

The present invention is related to a metallization structure on a fluorine-containing dielectric. This metallization structure includes a conductive pattern; a fluorine-containing dielectric; and a barrier layer containing a material, i.e. a near noble metal such as Co, Ni, Pt, and Pd. The barrier layer includes at least a first part, being positioned between the fluorine-containing dielectric and the conductive pattern, the first part containing at least a first and a second sub-layer, the first sub-layer contacting the fluorine-containing dielectric being impermeable for fluorine.

21 Claims, 2 Drawing Sheets

METALLIZATION STRUCTURE ON A FLUORINE-CONTAINING DIELECTRIC AND A METHOD FOR FABRICATION THEREOF

This application is a continuation of Ser. No. 09/237,876 filed Jan. 27, 1999 now U.S. Pat. No. 6,323,555, which claims the benefit of U.S. Provisional Application No. 60/072,895, filed on Jan. 28, 1998.

FIELD OF THE INVENTION

The present invention is related to a new metallization structure being part of a structure used to interconnect electronic components or devices. Such components or devices can be part of an integrated circuit. Particularly, a multi-level Cu-containing metallization structure is disclosed based on fluorine-containing dielectrics.

BACKGROUND OF THE INVENTION

The ongoing miniaturization in integrated circuits with increased complexity and multilevel metal layers and the focus on increasing speed of these circuits demand for low permittivity materials, particularly for use as intermetal dielectric layers. Conventionally, metal interconnects, mostly aluminum layers, with silicon dioxide as intermetal dielectric are used, but this conventional solution will not be able to meet the stringent specifications resulting from the above mentioned trends. Therefore, to avoid that the larger portion of the total circuit delay is caused by the resistance and capacitance of the interconnect system, one has to reduce the permittivity of the dielectric used. This is stated in numerous publications, e.g. in Table 1 of R. K. Laxman, "Low $\epsilon$ dielectric: CVD Fluorinated Silicon Dioxides", Semiconductor International, May 1995, pp. 71–74. Therefore miniaturization has lead to an intensified search for new low K materials. A low $\epsilon$ material, a low K material and a material with a low permittivity are all alternative expressions for a material with a low dielectric constant, at least for the purposes of this disclosure. The most desirable material should have a low K value, low mechanical stress, high thermal stability and low moisture absorption. Furthermore, the desired material should be selected based on the compatibility with state-of-the-art semiconductor processing steps and tools.

Part of the search for new low K materials was directed to changing the properties of silicon dioxide as deposited. Deposited silicon dioxide is the most widely used intermetal dielectric material having a K value of about 3.9. Several publications have indicated that the K value of silicon dioxide films can be reduced by introducing increasing amounts of fluorine in said films. Fluorine is the most electronegative and the least polarizable element on the periodic table. Incorporation of fluorine reduces the number of polarizable Si-OH bonds and also influences the silicon oxide such that it has a less polarizable geometry to thereby lowering the K value of the fluorinated silicon oxide films. A wide variety of processes to deposit fluorinated silicon oxide films are known like e.g. a Plasma Enhanced Chemical Vapour Deposition (PECVD) process as in the U.S. Pat. No. 5,641,581. Using these processes K values in the range between 3 and 3.5 are reported dependent on the amount of fluorine atoms incorporated, i.e. an increasing amount of fluorine leads to a decrease of the K value.

Besides the focus on changing the properties of silicon oxide, there is an ongoing search for new low K materials. Among these new materials are the organic spin-on materials, having a K value in the range from 2.5 to 3, and the inorganic low-K materials as e.g. xerogels having a K value typically lower than 1.5. Many of these new low-K materials comprise fluorine. The organic materials are of particular interest because they feature simplified processing, excellent gap-fill and planarization. Furthermore the K-value of organic materials, which comprise Phenyl groups, can be additionally lowered by plasma fluorination as e.g. in H. Kudo et al., Mat. Res. Symp. Proc., Vol. 381, pp. 105–110, 1985. By doing so the K-values can be lowered yielding a range from 2 to 2.5 instead of from 2.5 to 3.

In summary, it is clear that fluorine-containing dielectrics have in general a lower K-value than there unfluorinated counterparts. This holds both for polymer like and ceramic like dielectrics. Therefore fluorine-containing dielectrics are of particular interest in order to avoid that the larger portion of the total circuit delay is caused by the capacitance of the interconnect system. Despite all these advantages fluorine-containing dielectrics are not compatible with current metallization structures using metallization materials such as Ti, or Ta, or W, or the nitrides of each of the aforementioned materials, or Cu, or Al. This is due to the fact that the incorporation of fluorine has been shown to be detrimental for the aforementioned metallization materials.

AIMS OF THE INVENTION

It is an aim of the present invention to provide a metallization structure which is compatible with fluorine-containing dielectrics. Therefore, a layer has to be provided which is at least conductive and substantially impermeable for fluorine, i.e. forms a diffusion barrier for fluorine. Preferably, this layer has a low contact resistance to a silicon layer or silicon substrate. In case this metallization structure comprises Cu, a layer has to be provided which is substantially impermeable for Cu.

It is a further aim of the invention to provide a metallization structure being compatible with fluorine-containing dielectrics and comprising a layer which is at least conductive, impermeable for fluorine and impermeable for Cu. Even more preferably, this layer has a low contact resistance to a silicon layer or silicon substrate.

SUMMARY OF THE INVENTION

In an aspect of the invention a metallization structure is disclosed comprising a barrier layer, said barrier layer being formed on the exposed parts, i.e. the uncovered parts, of a fluorine-containing dielectric. This barrier layer should adhere well on said fluorine-containing dielectric. This barrier layer should also neither corrode nor reveal a deterioration of its characteristics by the exposure to a fluorine. Furthermore, this barrier layer should also form a diffusion barrier for fluorine, by forming stable non-volatile fluorides, in order to inhibit the corrosion of other parts of the metallization structure. According to this aspect of the invention, a metallization structure is disclosed comprising:

a conductive pattern;

a fluorine-containing dielectric; and a barrier layer comprising at least a first part, being positioned between said fluorine-containing dielectric and said conductive pattern, said first part consisting of a first sub-layer of a conductive material and a second sub-layer of a fluoride of said conductive material adjacent to said fluorine-containing dielectric. Particularly both the conductive pattern and the fluorine-containing dielectric can be completely encapsulated by the barrier layer.

In an embodiment of the invention, a metallization structure is disclosed comprising a barrier layer of a near noble metal which is at least highly impermeable for fluorine and preferably impermeable for Cu. Preferably the near noble metal Co is use which forms a barrier layer which is both substantially impermeable for fluorine and for Cu. Co is much less reactive than the refractory metals. Co adheres well on fluorine-containing silicon oxide based materials as well as on fluorine-containing organic polymers. Moreover, in contact with a silicon substrate Co can form a silicide-cobalt having a low resistivity and a low contact resistance to a silicon substrate. For the purposes of this disclosure, a silicide-cobalt is defined as $Co_xSi_y$, x and y being positive numbers. Moreover, the fluorides of Co are stable and non-volatile, i.e. contrary to e.g. Ti. Furthermore, it has been revealed that Co reacts readily with fluorine thereby forming an in-situ cobalt-fluoride layer, i.e. a layer of $Co_xF_y$, x and y being positive numbers. The growth of this cobalt-fluoride layer is self limiting resulting in a maximum thickness of the layer of about 5 nm. The thickness of this layer is typically 3 to 4 nm. Consequently, contrary to e.g. Ti which is permeable for fluorine, by the reaction of Co or another near noble metal, such as Ni, Pd or Pt, with a fluorine-containing dielectric a layer of a fluoride of this near noble metal is formed. This layer inhibits the out-diffusion of fluorine from said fluorine-containing dielectric and thereby avoids the exposure of other parts of the metallization structure to fluorine.

In another embodiment of the invention, a metallization structure is disclosed where the conductive pattern is composed of at least one metal selected from a group comprising Al, Cu, an Al-alloy and a Cu-alloy. Particularly, a Cu-containing metals is selected. This metallization structure can further comprise a barrier layer, impermeable for copper, being positioned between said conductive pattern and said contact barrier layer. Preferably, this barrier layer is a Ta layer or a compound thereof.

In another embodiment of the invention, a metallization structure is disclosed, further comprising a second part of said barrier layer of said conductive material, being positioned between silicon layer and said conductive pattern and wherein said second part is in contact with said silicon layer. Particularly, the silicon layer can be at least a part of a silicon wafer. This second part of said barrier layer comprises a first sub-layer of said conductive material, e.g. Co or another near noble material, and a second sublayer of a silicide of said conductive material, e.g. a silicide-cobalt, said second sub-layer contacting said silicon layer. This second sub-layer provides a low ohmic contact to the exposed parts of the silicon layer.

In another aspect of the invention, a method for fabricating a metallization structure on a substrate is disclosed, comprising the steps of:

depositing a layer of a conductive material on at least one exposed surface of a fluorine-containing dielectric formed on said substrate;

allowing the reaction between said layer of said conductive material and said fluorine-containing dielectric to thereby form a layer of a fluoride of said conductive material at the interface between said layer of said conductive material and said fluorine-containing dielectric; and depositing at least one metal on said layer of said conductive material. depositing a contact barrier layer on a patterned fluorine-containing dielectric layer thereby creating a diffusion barrier for fluorine; and forming a conductive pattern on said first contact barrier.

In a further embodiment of the present invention the reaction between the layer of the conductive material, i.e. the barrier layer, and the fluorine-containing dielectric is stimulated by heating the substrate. Particularly, this heating can be performed at a temperature between room temperature and 500 degrees C., or between 50 degrees C. and 500 degrees C., or between 50 degrees C. and 300 degrees C.

In another embodiment of the invention, a method is disclosed to fabricate a metallization structure, wherein prior to the formation of the conductive pattern, preferably composed of Cu or a Cu-alloy, an additional layer, impermeable for Cu, is deposited on the barrier layer of the near noble metal. Preferably, this additional layer is a layer comprising Ta or a compound thereof.

Figure 1A:
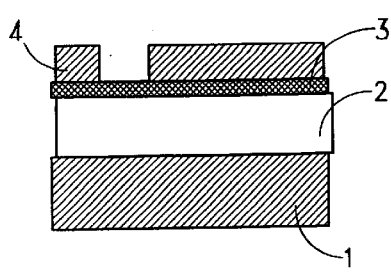
FIG. 1 depicts a schematic process-flow used to fabricate a particular metallization structure, i.e. a dual-damascene structure, according to an embodiment of the invention.
Figure 1E:
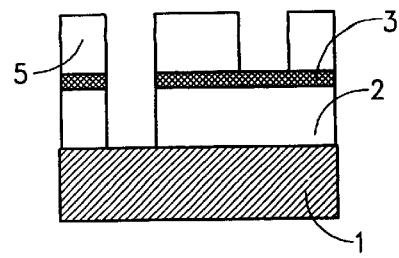
Figure 1B:
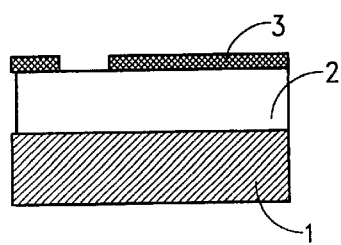
Figure 1F:
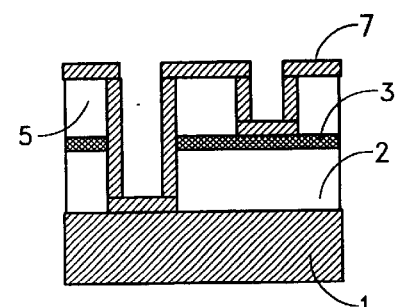
Figure 1C:
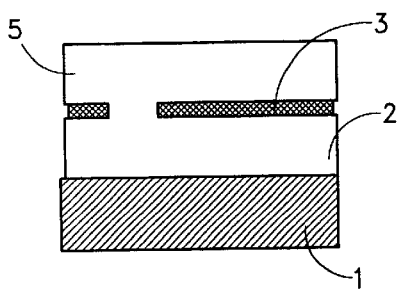
Figure 1G:
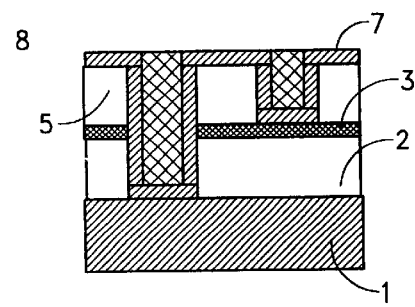
Figure 1D:
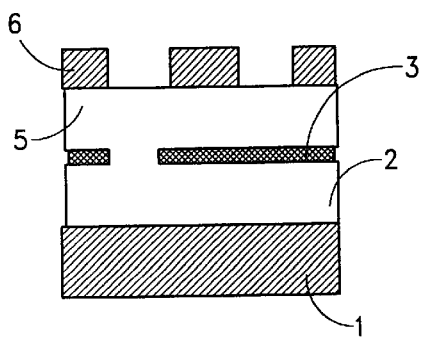
Figure 1H:
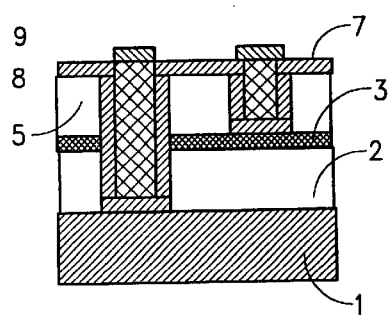

A Co layer with a thickness of 10 nm is deposited by means of a physical vapor deposition technique on an in-situ fluorinated FLARE™ II layer. The thickness of the FLARE™ II layer is 600 nm. Prior to the Co deposition the FLARE™ II layer is in-situ fluorinated by exposure in a chamber of a plasma tool to an ambient comprising $NF_3$. The pressure in the chamber was 1.3 Torr will the ambient temperature was 80 degrees C.

The FLARE™ II layer was deposited on a silicon wafer with a silicon dioxide layer thereon.

After the Co deposition, some samples (21) were heated during 10 minutes at 350 degrees C., while some samples (20) were not subjected to a heat treatment. Next, samples are given for XPS analysis. The analysis is performed at the interface layer between the Co and the fluorinated FLARE™ II layer.

Figure 2A:
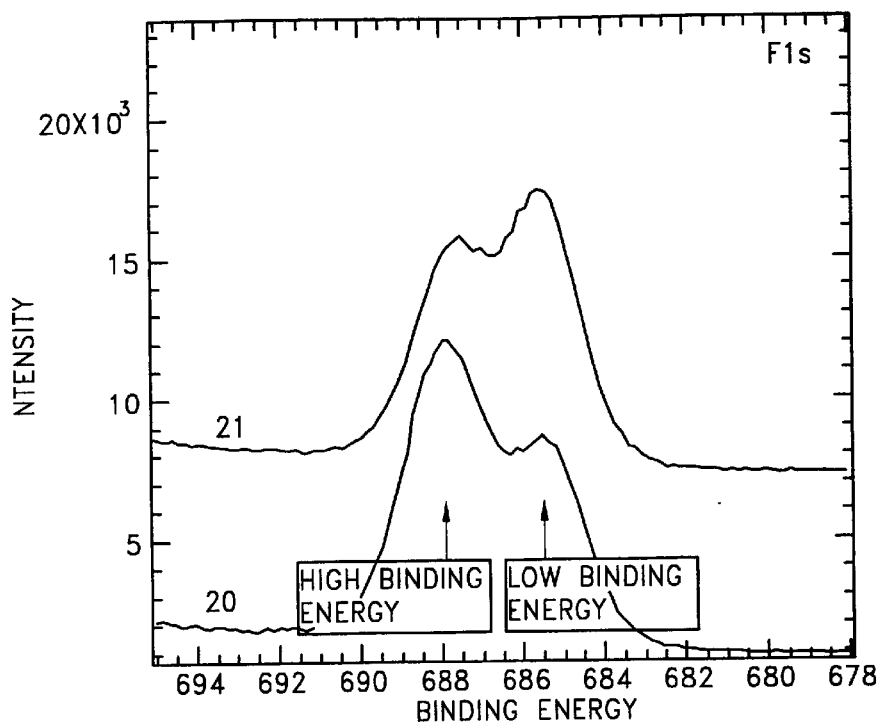
FIG. 2 depicts XPS (X-ray Photo-electron Spectroscopy) spectra of some samples which are configured as follows.

FIG. 2a) depicts the F 1s peak.

Figure 2B:
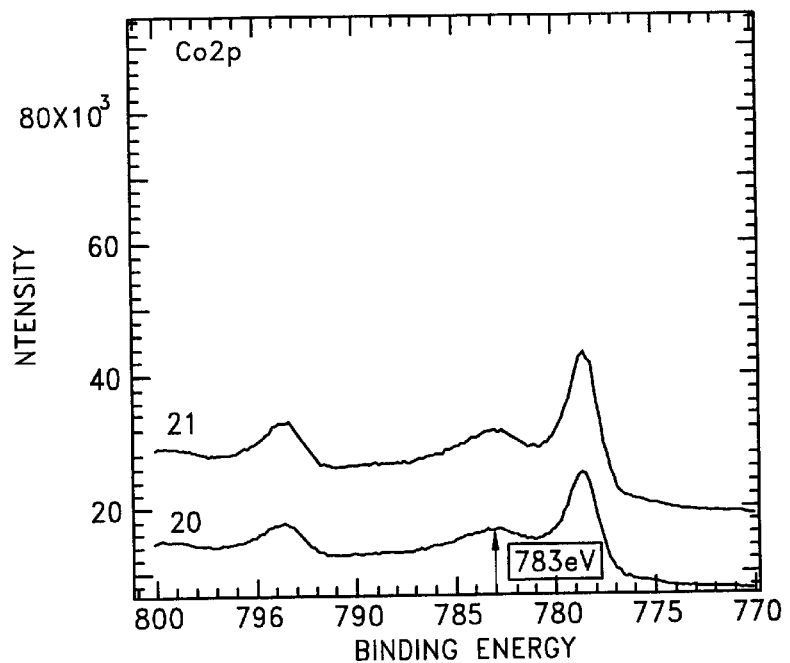

FIG. 2b) depicts the Co 2p peak.

Remark that the intensity scale in both pictures may only be used to determine relative intensities.

Both samples have a very intense F peak. In addition, the Co2p peak of both samples has a clear high binding energy structure (~783 eV) which can be related to the low binding energy peak of the F1s peak and attributed to a fluoride of Co. The high binding energy peak of the F1s peak is attributed to C-F bounds, where the C originates from the FLARE™ II layer.

When comparing the spectra of the samples with (21) or without heat treatment (20), from the F1s spectra, it can be concluded that the fluoride intensities are significantly higher than the C-F intensities. This indicates a stronger reaction due to the heat treatment.

DETAILED DESCRIPTION OF THE INVENTION

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

The introduction of fluorine-containing dielectrics in modern and future semiconductor processes requests a metallization structure which is compatible with said fluorine-containing dielectrics. This fluorine-containing dielectric can be a polymer like or ceramic like dielectric, e.g. a fluorinated silicon oxide. Alternatively this fluorine-containing dielectric can also be a dielectric where the fluorine is introduced only after the deposition, for instance by plasma fluorination. This holds especially for organic polymers comprising unsaturated carbon bonds such as phenyl groups. Examples of organic polymers comprising phenyl groups are the benzocyclobutarenes, i.e. benzocyclobutene (BCB) commercially available as Cyclotene 5021™, poly arylene ether, i.e FLARE™ II, aromatic hydrocarbon, i.e. SILK™, polyimides. An advantage of introducing fluorine after the deposition is that this fluorination can be performed locally. This fluorine-containing dielectric is formed on a substrate. The substrate can be a partly processed or a pristine wafer or slice of a semiconductive material, like Si or Ga As or Ge, or an insulating material, e.g. a glass slice, or a conductive material. Said substrate can comprise a patterned conductive layer. Particularly, in case said substrate is a partly processed wafer or slice; at least a part of the active and/or passive devices can already be formed and/or at least a part of the structures interconnecting these devices can be formed.

In order to be compatible with a fluorine-containing dielectric a metallization structure has to be configured comprising a barrier layer, said barrier layer being formed on the exposed parts, i.e. the uncovered parts, of a fluorine-containing dielectric. This barrier layer should adhere well on said fluorine-containing dielectric. This barrier layer should also neither corrode nor reveal a deterioration of its characteristics by the exposure to fluorine. Furthermore, this barrier layer also has to form at least a diffusion barrier for fluorine in order to inhibit the corrosion of other parts of the metallization structure. Preferably this barrier layer should also form a diffusion barrier layer for Cu.

In an embodiment of the invention, a metallization structure is disclosed comprising a barrier layer, said layer comprising a near noble metal. Preferably the near noble metal Co is used. Co is much less reactive than the refractory metals. Co adheres well on fluorine-containing silicon oxide based materials and fluorine-containing polymers. The fluorides of Co are stable and non-volatile, i.e. contrary to e.g. Ti. A further advantage of Co is that it can be selectively deposited using an electroless plating technique. It has been revealed (see also FIG. 2) that Co reacts readily with fluorine thereby forming an in-situ cobalt-fluoride layer, i.e. a layer of $Co_xF_y$, x and y being positive numbers. The growth of this cobalt-fluoride layer is a self limiting reaction yielding a maximum thickness of about 5 nm. This reaction can occur spontaneously (20) dependent on the deposition technique used for the deposition of Co or stimulated by applying a heat treatment (21). Consequently, contrary to e.g. Ti which is permeable for fluorine, by the reaction of Co with a fluorine-containing dielectric a diffusion barrier is formed inhibiting the out-diffusion of fluorine from said fluorine-containing dielectric and thereby avoiding exposure of other parts of the metallization structure to fluorine. Furthermore, in contact with a silicon substrate Co can form a silicide-cobalt having a low resistivity and a low contact resistance to a silicon substrate. For the purposes of this disclosure, a silicide-cobalt is defined as $Co_xSi_y$, x and y being positive numbers.

Besides a barrier layer, preferably comprising a near noble metal, particularly Co, said metallization structure can further comprise a conductive pattern, for instance a conductive line or a set of conductive lines. Preferably, said conductive pattern is composed of Cu or a Cu alloy. Cu is an interesting material due to its low resistivity. Furthermore, from the binary phase diagrams, it is known that Co does not form intermetallic compounds with Cu. Using Cu can also have some disadvantages. A first possible disadvantage is that Cu easily corrodes when being exposed to fluorine. However, this corrosion is inhibited by the in-situ formed barrier layer of a fluoride of cobalt which inhibits the out-diffusion of fluorine. A second possible disadvantage can be the migration of Cu in the surrounding materials resulting in a deterioration of the electrical and mechanical characteristics of these materials. However the in-situ formed barrier layer of cobalt-fluoride is also a diffusion barrier for Cu. Therefore said barrier layer can be used to encapsulate the Cu.

In another embodiment of the invention, as an example, a metallization structure and a method for fabricating this particular metallization structure, i.e. a dual damascene structure, is proposed (see FIG. 1). It should be clear however that the invention is not limited to this particular structure but the present invention can be applied for any metallization structure comprising a fluorine-containing dielectric. Metallization structures are structures used to connect and interconnect active and/or passive devices. These structures can comprise multiple metal levels which are, dependent on the desired connection pattern, either separated one from another by means of interlevel or intralevel fluorine-containing dielectric layers or connected one to the other by means of a conductive connection through the fluorine-containing dielectric layer(s). These fluorine-containing layers can comprise openings such as via holes, trenches or contact openings.

EXAMPLE

On a flattened substrate, i.e. a silicon wafer (1), a first fluorine-containing dielectric layer (2) is formed. This fluorine-containing dielectric can be a polymer like or ceramic like dielectric, e.g. a fluorinated silicon oxide. Alternatively this fluorine-containing dielectric can also be a dielectric where the fluorine is introduced only after the deposition, for instance by plasma fluorination. This holds for organic polymers comprising Phenyl groups. Examples of such polymers are the benzocyclobutarenes, i.e. benzocyclobutene (BCB) commercially available as Cyclotene 5021™, poly arylene ether, i.e FLARE™ II, aromatic hydrocarbon, i.e. SILK™, polyimides. An advantage of introducing fluorine after the deposition is that this fluorination can be performed locally.

A hard mask layer (3), e.g. a silicon nitride layer, is formed on the first fluorine-containing dielectric layer. A hard mask layer is defined as a layer which can be etched selective to the underlying dielectric layer. A lithographic resist layer (4) is deposited and patterned (step a)). The hard mask layer is patterned (step b)) with a RIE (reactive ion etch) step using the patterned lithographic developed resist (4) as a mask thereby creating at least one hole where the surface of the first fluorine-containing dielectric layer is exposed. After the RIE step the resist left-over is removed.

A second fluorine-containing dielectric layer (5) is formed (step c)) over the patterned hard mask layer and a resist layer (6) is formed on this second fluorine-containing dielectric layer. The resist layer is patterned (step d)) and the second fluorine-containing dielectric layer is etched using the patterned resist layer as a mask which can result in the formation of a trench. The hard mask layer functions as an etch stop layer thereby preventing the extension from the trench in the first fluorine-containing dielectric layer (step e)). The first dielectric layer is then etched using the patterned hard mask layer as a mask to form a contact to the substrate, i.e. exposing the surface of the substrate (step e)). The etching of the first and second dielectric layer can be performed using a single etch step or two etch steps. The patterned resist layer is removed.

A thin layer (7) of a near noble metal, preferably Co, is formed (step f)) over the exposed parts of the hard mask layer and the first and second fluorine-containing dielectric layer. By the reaction of Co and F, said F being supplied by said dielectric layer, a cobalt-fluoride layer, i.e. a layer of $Co_xF_y$, x and y being positive numbers, is formed at the interface between said dielectric layer and said Co layer to thereby form a diffusion barrier for said fluorine. This reaction can be stimulated by a heating step. However the growth of the cobalt-fluoride layer is a self-limiting process yielding a maximum thickness of 5 nm. At the contact area to the substrate, i.e. at the interface between the substrate and the Co layer, a fluorinated cobaltsilicide is formed with a low contact resistance. So as explained before, in fact a contact barrier layer is formed.

A conductive layer (8), preferably a Cu layer, is deposited. The Cu layer fills the contact in the first and second dielectric layer and the trench in the second dielectric layer.

The conductive layer is planarized (step g)) to electrically isolate the trenches or contacts one from another. This planarization can be performed using chemical mechanical polishing (CMP). The Cu is almost completely encapsulated by the Co inhibiting the out-diffusion of the Cu, only at the topside the Cu is still uncovered.

In order to completely encapsulate the Cu, a second layer of Co (9) can be deposited selectively (step h)) on the Cu. Subsequent deposition of a third fluorine-containing dielectric (or exposure to fluorine) will lead to a similar formation of a cobalt-fluoride layer on said second Co layer and completely encapsulate the Cu.

Co is typically a metal that allows deposition by electroless plating. If an adequate activation is performed, Cu as well as Co can be deposited using plating deposition. Consequently the complete metallization sequence as described in the example but not limited hereto can be carried out using plating deposition without the need for physical vapour deposition (PVD).

In an embodiment of the invention, a method for fabricating a metallization structure is disclosed comprising the steps of:

depositing a first thin Co layer, or a layer of another near noble metal like e.g. Ni, Pd and Pt, on a first fluorine-containing dielectric layer, said deposition leading to the reaction of Co and F, said F being supplied by said first dielectric layer, to thereby grow a cobalt-fluoride layer at the interface between said first dielectric layer and said first Co layer;

depositing Cu, or another metal like e.g. Al or an Al alloy, on said first Co layer;

depositing a second Co layer selectively on the Cu exposing said second Co layer to fluorine, e.g. by depositing a second fluorine-containing dielectric on said second Co layer, leading to the formation of a cobalt-fluoride layer on said Co.

In a further embodiment of the invention, a metallization structure is fabricated by first depositing a Co layer, with a thickness typically between 80 nm and 200 nm, or a layer of another near noble metal like e.g. Ni, Pd and Pt, on a fluorine-containing dielectric layer. Preferably this fluorine-containing dielectric comprises at least one opening as e.g. a via hole or a trench. This deposition can e.g. be done using a physical vapor deposition technique and such that a barrier layer is formed at least in these openings. This deposition leads to the reaction of Co and F, said F being supplied by said dielectric layer, to thereby grow a layer of a fluoride of said Co at the interface between said dielectric layer and said first Co layer. This reaction can be stimulated by applying a heating step. Anyhow, as this reaction is self-limiting the thickness of the layer of said fluoride is typically between 3 and 5 nm. This fluoride layer forms a diffusion barrier layer which is both impermeable for fluorine and Cu. Particularly, thereafter the Co layer on this fluoride layer can be removed selectively to the underlying fluoride layer by an electrochemical etch. Thereafter a Cu-containing metal can be deposited on the fluoride layer, preferably by means of electroplating, to thereby at least completely fill these openings.

What is claimed is:

1. A metallization structure comprising:

a conductive pattern;

a fluorine-containing dielectric; and a barrier layer comprising at least a first part, being positioned between said fluorine-containing dielectric and said conductive pattern, said first part comprising a first sub-layer of a conductive material and a second sub-layer of a fluoride of said conductive material adjacent to said fluorine-containing dielectric, wherein said second sub-layer inhibits out-diffusion of fluorine from said fluorine-containing dielectric.

2. The structure as recited in claim 1, wherein said barrier layer completely encapsulates said fluorine-containing dielectric.

3. The structure as recited in claim 1, wherein said barrier layer completely encapsulates said conductive pattern.

4. The structure as recited in claim 1, where said conductive pattern is composed of at least one metal selected from the group consisting of Al, Cu, an Al-alloy and a Cu-alloy.

5. The structure as recited in claim 1, where said conductive material is a metal selected from the group consisting of Co, Ni, Pt and Pd.

6. The structure as recited in claim 1, wherein said fluorine-containing dielectric comprises at least one opening.

7. The structure as recited in claim 6, wherein said opening is a via hole or a trench.

8. The structure as recited in claim 1, where said conductive pattern is composed of Cu or a Cu-alloy.

9. The structure as recited in claim 8, further comprising a Cu-barrier layer, being impermeable for copper and positioned between said conductive pattern and said barrier layer.

10. The structure as recited in claim 9, where said Cu-barrier layer is a Ta layer or a compound thereof.

11. The structure a recited in claim 1, wherein said barrier layer further comprises a second part, being positioned between a silicon layer and said conductive pattern said second part consisting of a third sub-layer of said conductive material and a fourth sub-layer of a silicide of said conductive material, said fourth sub-layer contacting said silicon layer.

12. The structure as recited in claim 11, where said silicon layer is at least a part of a silicon wafer.

13. A method for fabricating a metallization structure on a substrate comprising the steps of:

depositing a layer of a conductive material on at least one exposed surface of a fluorine-containing dielectric formed on said substrate;

allowing the reaction between said layer of said conductive material and said fluorine-containing dielectric to thereby form a layer of a fluoride of said conductive material at the interface between said layer of said conductive material and said fluorine-containing dielectric, wherein said layer of said fluoride of said conductive material inhibits out-diffusion of fluorine from said fluorine-containing dielectric; and depositing at least one metal on said layer of said conductive material.

14. The method as recited in claim 13, wherein said metal is selected from the group consisting of Al, Cu, an Al-alloy and a Cu-alloy.

15. The method as recited in claim 13, wherein said conductive material is a metal selected from the group consisting of Co, Ni, Pt and Pd.

16. The method as recited in claim 13, wherein prior to the deposition of said metal a Cu-barrier layer is formed at least on said layer of said conductive material.

17. The method as recited in claim 16, wherein said Cu-barrier layer is a layer comprising Ta or a compound thereof.

18. The method as recited in claim 13, wherein said reaction is stimulated by heating said substrate.

19. The method as recited in claim 14, wherein said heating is performed at a temperature in the range from 50 degrees C. to 500 degrees C.

20. The method as recited in claim 14, wherein said heating is performed at a temperature in the range from 50 degrees C. to 350 degrees C.

21. The method as recited in claim 14, wherein said heating is performed at a temperature in the range from 50 degrees C. to 300 degrees C.

* * * * *